(12) United States Patent
Kijima et al.

(10) Patent No.: US 6,197,600 B1
(45) Date of Patent: Mar. 6, 2001

(54) FERROELECTRIC THIN FILM, MANUFACTURING METHOD THEREOF AND DEVICE INCORPORATING THE SAME

(75) Inventors: Takeshi Kijima, Omiya; Maho Ushikubo, Kashiwa; Hironori Matsunaga, Noda, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/072,359

(22) Filed: May 5, 1998

(30) Foreign Application Priority Data

May 13, 1997 (JP) .................................................. 9-139283

(51) Int. Cl.[7] ........................ H01L 21/00; H01L 21/8242
(52) U.S. Cl. ................................... 438/3; 438/240
(58) Field of Search ................ 438/3, 240, 239, 438/238, 197, 142

(56) References Cited

U.S. PATENT DOCUMENTS

| | | | |
|---|---|---|---|
| 5,665,210 | * 9/1997 | Yamazaki | 438/3 |
| 5,821,005 | * 10/1998 | Kijima et al. | 428/701 |
| 5,874,364 | * 2/1999 | Nakabayashi et al. | 438/738 |
| 5,902,639 | * 5/1999 | Glassman et al. | 427/248.1 |
| 5,998,236 | * 12/1999 | Roeder et al. | 438/104 |

FOREIGN PATENT DOCUMENTS

| | | |
|---|---|---|
| 8-161933 | 6/1996 | (JP). |
| 8-306231 | 11/1996 | (JP). |
| 9-186376 | 7/1997 | (JP). |

OTHER PUBLICATIONS

Muhammet et al., Jpn. J. Appl. Phys., vol. 33, pp. 5215–5218 (1994).

Nakamura et al., Jpn. J. Appl. Phys., vol. 32, pp. 4086–4088 (1993).

* cited by examiner

*Primary Examiner*—Richard Elms
*Assistant Examiner*—Adam Pyonin
(74) *Attorney, Agent, or Firm*—Birch, Stewart, Kolasch & Birch, LLP

(57) ABSTRACT

A ferroelectric thin film includes: a bismuth oxide polycrystal thin film constituting a buffer layer, and a bismuth-based layered compound thin film represented by the formula: $Bi_2A_{m-1}BmO_{3m+3}$ wherein A is an atom selected from the group consisting of Na, K, Pb, Ca, Sr, Ba and Bi; B is an atom selected from the group consisting of Fe, Ti, Nb, Ta, W and Mo; and m is an integer of 1 or more. The bismuth oxide polycrystal thin film and the bismuth-based layered compound thin film are formed into a single-phase.

11 Claims, 14 Drawing Sheets

Sample A

Sample C

|—|
100nm

Sample D

Sample D

Sample E

Sample E

FERROELECTRIC THIN FILM, MANUFACTURING METHOD THEREOF AND DEVICE INCORPORATING THE SAME

CROSS-REFERENCES TO RELATED APPLICATIONS

This application is related to Japanese Patent Application No. HEI 9(1997)-139283, filed on May 13, 1997 whose priority is claimed under 35 USC §119, the disclosure of which is incorporated herein by reference in its entirety.

BACKGROUND OF THE INVENTION

1. Field of the Invention

The present invention relates to a ferroelectric thin film, a manufacturing method thereof and a device incorporating the same. More particularly, it relates to a ferroelectric thin film, a manufacturing method thereof and a device incorporating the same which can be applied to a ferroelectric memory element, a pyroelectric sensor, a piezoelectric element and the like.

2. Description of the Related Arts

Having numerous properties such as spontaneous polarization, high dielectric constant, electrooptical effect, piezoelectric effect, pyroelectric effect and the like, a ferroelectric is applied to a wide range of devices such as capacitors, oscillators, optical modulators, infrared sensors and the like.

Recently, by applying the spontaneous polarization property of the ferroelectric to a memory, a ferroelectric non-volatile memory has been realized which shows a great improvement in operation speed and data rewriting time as compared with a conventional non-volatile memory such as an EEPROM or flash memory. Also, by utilizing the high dielectric constant property, the capacitor size is made smaller, whereby high integration of semiconductor elements such as DRAMs is achieved, and a device of giga bit size is fabricated on an experimental basis.

As described above, it is essential to develop a technique for reducing the thickness of a ferroelectric film in conformity with the conventional semiconductor processes in order to apply the ferroelectric to various devices such as semiconductor elements. In other words, it is desired to develop ferroelectric materials which can realize a desired property with a small thickness produced by lowering the film-forming temperature and by making a dense and flat film whereby the ferroelectric thin film is suitable for fine processing and reduction of operation voltage. Also, it is desired to develop a technique for reducing the thickness of ferroelectric films.

Conventionally, lead titanate zirconate ($Pb(Zr_{1-x}Ti_x)O_3$; PZT) has been widely used as the ferroelectric material. However, PZT accompanies a problem that deterioration of ferroelectric property (film fatigue) generated by repetition of polarization inversion is large.

Among bismuth-based layered compounds represented by the formula: $Bi_2A_{m-1}B_mO_{3m+3}$ (wherein A is at least one element selected from the group consisting of Na, K, Pb, Ca, Sr, Ba, and Bi; and B is at least one element selected from the group consisting of Fe, Ti, Nb, Ta, W and Mo), ferroelectric materials such as bismuth titanate ($Bi_4Ti_3O_{12}$), strontium bismuth tantalate niobate ($SrBi_2(Ta_{1-x}Nb_x)_2O_9$) ($0 \leq X \leq 1$) and the like are attracting public attention because of their resistance to film fatigue, and has been widely developed in a technique for reducing the film thickness.

Especially among these ferroelectric materials, $Bi_4Ti_3O_{12}$ (rhombic system, lattice constants: a=5.4100Å, b=5.4489Å, c=32.815Å (JCPDS data card 35-795)) is a material showing a ferroelectric property with a strong anisotropy. A bulk ferroelectric property of the material shows a spontaneous polarization of 50 $\mu C/cm^2$ and a coercive field of 50 kV/cm along the a-axis. The spontaneous polarization of the material is the largest among the above bismuth-based layered compounds. In contrast, the material has a very small coercive field of 4 kV/cm along the c-axis although the spontaneous polarization along the c-axis is as small as 4 $\mu C/cm^2$.

A $Bi_4Ti_3O_{12}$ film is formed with a small thickness by a number of methods such as a MOCVD method, a sol-gel method, a sputtering method and the like.

A lot of reports on the sol-gel method are provided because of its facility in film-forming control. However, the sol-gel method generally involves high temperature thermal treatment of 650° C. or more with the grain size being as large as about 0.5 $\mu m$, so that it is difficult to obtain a good property with a film thickness of 200 nm or less and application to fine processing is also difficult.

On the other hand, the MOCVD method is expected for application to a practical device processes because reduction of the film thickness of a large area is generally possible and the step coverage is good. However, reduction of the film thickness of $Bi_4Ti_3O_{12}$ by a conventional MOCVD method is carried out at a high substrate temperature of 600° C. or more and, moreover, the obtained film is in most cases a c-axis oriented film having large crystal particles. Therefore, it was not possible to obtain a thin film of $Bi_4Ti_3O_{12}$ having a large polarization component along the a-axis.

Further, a three-step growth method is recently proposed by the inventors of the present invention (See Japanese Unexamined Patent Publication No. HEI 8(1996)-306231). According to the method, growth of main $Bi_4Ti_3O_{12}$ thin film to be formed on a buffer layer is achieved at a low substrate temperature of 400° C. by using a double buffer structure in which a very thin titanium oxide buffer layer is formed on a substrate at a substrate temperature of 400° C. and, further, a very thin $Bi_4Ti_3O_{12}$ film is laminated thereon at a substrate temperature of 400° C. to 650° C. The obtained thin film has superior crystallinity, density and surface flatness and is shown to have, in the case of a film thickness of 200 nm or less, a better ferroelectric property than those previously reported.

However, in addition to good ferroelectric property, simplification of the process is earnestly desired. Further, the thin film of $SrBi_2(Ta_{1-x}Nb_x)_2O_9$ has a property that the film fatigue generated by the polarization inversion is very small although the remaining spontaneous polarization thereof is about 10 $\mu C/cm^2$ which is inferior to that of $Bi_4Ti_3O_{12}$.

Reduction of the thickness of $SrBi_2(Ta_{1-x}Nb_x)_2O_9$ film is carried out mainly by a coating film-forming method such as the sol-gel method or a MOD method.

However, it is believed that a thermal treatment for the method needs a temperature of 800° C. or more, so that it is difficult to apply the method to fabrication of semiconductor devices by itself. Namely, in the coating film-forming method, it is difficult to finely control the film thickness and also, since the method involves a high temperature process, reaction of the film with other materials constituting the device and the like occurs; and further, the grain size is large, so that the method is not suitable for fine processing. Therefore, reduction of the film-forming temperature is desired.

Generally, in order to apply a ferroelectric material to a semiconductor device, it is desired to suppress the reaction of a film with other materials constituting the device including an electrode material by lowering the film-forming temperature and to realize a dense thin film having a flat surface so as to obtain a good ferroelectric property with a small film thickness of 200 nm or less.

However, as described above, technique for obtaining a good ferroelectric property as well as realizing a fine processing and the like has not been achieved and is not fully applied to practical device development.

SUMMARY OF THE INVENTION

The present invention provides a ferroelectric thin film comprising: a bismuth oxide polycrystal thin film constituting a buffer layer, and a bismuth-based layered compound thin film represented by the formula: $Bi_2A_{m-1}B_mO_{3m+3}$ wherein A is an atom selected from the group consisting of Na, K, Pb, Ca, Sr, Ba and Bi; B is an atom selected from the group consisting of Fe, Ti, Nb, Ta, W and Mo; and m is an integer of 1 or more, the bismuth oxide polycrystal thin film and the bismuth-based layered compound thin film being formed into a single-phase.

Also, the present invention provides a process of manufacturing a ferroelectric thin film, comprising the steps of: vaporizing organic metal materials each containing one of the metal elements constituting the ferroelectric thin film to yield organic metal material gases; supplying the organic metal material gases onto a substrate having a bismuth oxide polycrystal thin film as a buffer layer together with an oxygen-containing gas and a carrier gas so as to form a bismuth-based layered compound thin film represented by the formula: $Bi_2A_{m-1}B_mO_{3m+3}$ (wherein A is an atom selected from the group consisting of Na, K, Pb, Ca, Sr, Ba and Bi; B is an atom selected from the group consisting of Fe, Ti, Nb, Ta, W and Mo; and m is an integer of 1 or more), by the MOCVD method, whereby the previously formed bismuth oxide polycrystal thin film and the bismuth-based layered compound thin film are combined into a single-phase ferroelectric thin film.

Further, the present invention provides a capacitor element comprising a lower electrode layer, a ferroelectric thin film described above, and an upper electrode layer which are formed successively on a substrate.

Also, the present invention provides a ferroelectric non-volatile memory element of FET type comprising a ferroelectric thin film described above which is used as a gate insulating film of a MOSFET on a semiconductor substrate, whereby an electric current flowing through a channel portion of the MOSFET is switched in accordance with a spontaneous polarization direction of the ferroelectric thin film.

Accordingly, the purpose of the present invention is provide a ferroelectric thin film, a manufacturing method therefor and a ferroelectric thin film element capable of lowering the film-forming temperature, reducing the film thickness and controlling the orientation of the film with a simpler film-forming process as compared with the conventional method for manufacturing a ferroelectric thin film.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

Figure 1:
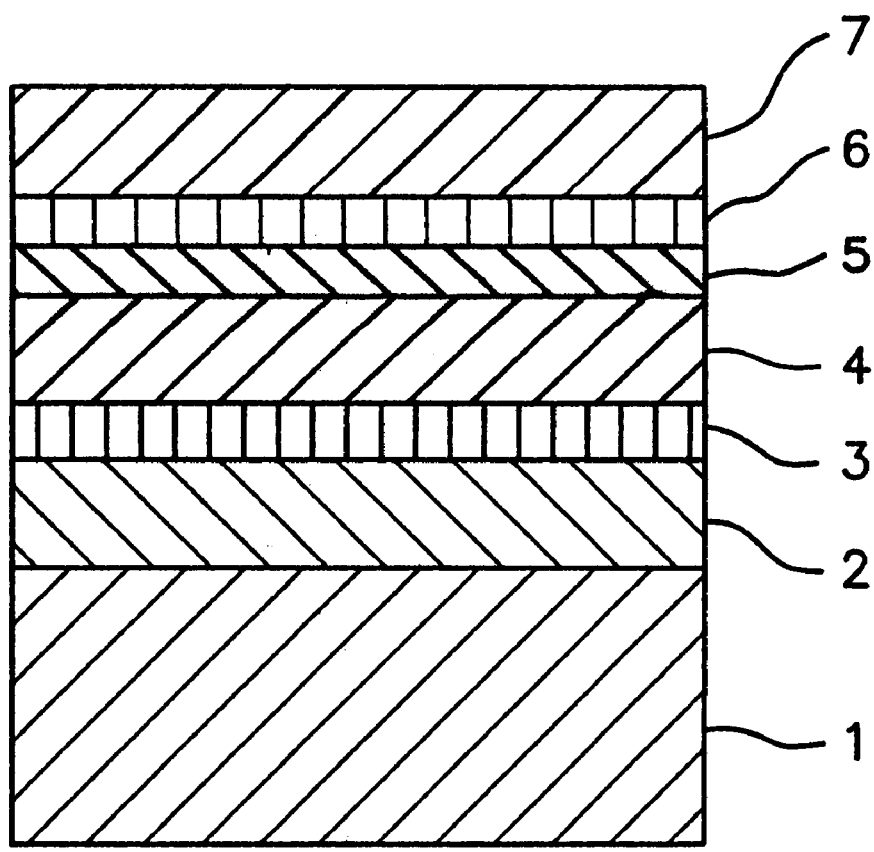
FIG. 1 is a schematic cross-sectional view illustrating an embodiment of a capacitor utilizing a ferroelectric thin film of the present invention.

The ferroelectric thin film of the present invention comprises a bismuth oxide polycrystal thin film and a bismuth-based layered compound thin film which are formed into a single-phase.

The bismuth oxide polycrystal thin film functions as a buffer layer for the bismuth-based layered compound thin film. However, when the bismuth-based layered compound thin film is formed thereon, the bismuth oxide polycrystal thin film is ultimately integrated with the bismuth-based layered compound thin film to be formed into a single-phase. Here, the term "single-phase" indicates that the intended ferroelectric thin film shows a single crystal structure. Therefore, it means that the bismuth oxide polycrystal thin film and the bismuth-based layered compound thin film are integrated to show the intended crystal structure of ferroelectric thin film, preferably a layered perovskite structure.

The bismuth oxide polycrystal thin film can be formed by selecting a conventional method such as the MOCVD method, the sol-gel method, a reactive vapor deposition method, a EB vapor deposition method, the sputtering method, a laser ablation method and the like. In forming the bismuth oxide polycrystal thin film, bismuth oxide may be formed in a form of polycrystal film, or alternatively bismuth oxide may be formed in an amorphous and then transformed into a polycrystal film. Among these methods, it is preferable to form the film by the MOCVD method. The process for forming the film by the MOCVD method may be a method in which the film is formed by using an organic material gas containing bismuth, an oxygen-containing gas and an optional carrier gas. At this time, pressure in forming the film, total flow rate of the used gases, flow rate of the material gas, flow rate of the carrier gas and flow rate of the oxygen-containing gas may be maintained constant or may be suitably varied. For example, the flow rates of the material gas and the oxygen-containing gas may be suitably adjusted depending on the size of the film-forming apparatus, the thickness of the film to be formed and the like, preferably about 100 to 700 sccm and 100 to 2000 sccm, respectively.

The material gas containing bismuth may be, for example, $BiH_3$, $BiCl_3$, $BiBr_3$, $BiI_3$, $Bi(CH_3)_3$, $Bi(C_2H_5)_3$, $Bi(n-C_3H_7)_3$, $Bi(n-C_4H_9)_3$, $Bi(i-C_4H_9)_3$, $Bi(n-C_5H_{11})_3$, $Bi(C_6H_5)_3$, $Bi(o-C_7H_7)_3$, $Bi(2-CH_3C_6H_4)_3$, $Bi(4-CH_3C_6H_4)_3$, $Bi(OCH_2CH_2N(CH_3)_2)_3$, $Bi(OCHCH_3CH_2N(CH_3)_2)_3$, $Bi(OC(CH_3)_2CH_2CH_3)_3$ and the like. Among these, $Bi(o-C_7H_7)_3$ is preferable.

The oxygen-containing gas may be, for example, a gas containing oxygen at 1 to 100 vol %, preferably 20 to 100 vol %.

The carrier gas may be an inert gas such as argon gas or nitrogen gas. If the carrier gas is to be used, the mixing ratio of the material gas and the oxygen-containing gas with respect to the carrier gas may be suitably adjusted in the range of 100:1 to 1:100 by volume.

Further, the film-forming temperature at this time is preferably 600° C. or less, more preferably in the range of 350 to 450° C.

The bismuth oxide polycrystal thin film is preferably formed to a thickness of 50 nm or less, more preferably to a thickness of about 10 to 50 nm.

The ferroelectric thin film of the present invention is constituted by bismuth-based layered compound thin film formed on the bismuth oxide polycrystal thin film. Here, the bismuth-based layered compound thin film may be formed of, for example, a compound represented by the formula: $Bi_2A_{m-1}B_mO_{3m+3}$ wherein A is an atom selected from the group consisting of Na, K, Pb, Ca, Sr, Ba and Bi; B is an atom selected from the group consisting of Fe, Ti, Nb, Ta, W and Mo; and m is an integer of 1 or more.

Specifically, the bismuth-based layered compound thin film may be formed of, for example, $Bi_4Ti_3O_{12}$, $SrBi_2Ta_2O_9$, $SrBi_2Nb_2O_9$, $BaBi_2Nb_2O_9$, $BaBi_2Ta_2O_9$, $PbBi_2Nb_2O_9$, $PbBi_2Ta_2O_9$, $PbBi_4Ti_4O_{15}$, $SrBi_4Ti_4O_{15}$, $BaBi_4Ti_4O_{15}$, $PbBi_4Ti_4O_{15}$, $Sr_2Bi_4Ti_5O_{18}$, $Pb_2Bi_4Ti_5O_{18}$, $Na_{0.5}Bi_{4.5}Ti_4O_{15}$, $K_{0.5}Bi_{4.5}Ti_4O_{15}$ and the like. Among these, $Bi_4Ti_3O_{12}$ is preferable.

The bismuth-based layered compound thin film can be formed by selecting a conventional method such as the MOCVD method, the sol-gel method, the reactive vapor deposition method, the EB vapor deposition method, the sputtering method, the laser ablation method and the like. Among these, the MOCVD method is preferable. The bismuth-based layered compound thin film may be formed by the MOCVD method in the same manner as described above except for the kind or the number of material gases to be used.

With respect to the material gas, a bismuth-based material gas is as described above. A lead-based material gas may be, for example, $PbCl_2$, $Pb(CH_3)_4$, $Pb(C_2H_5)_4$, $Pb(n-C_3H_7)_4$, $Pb(i-C_3H_7)_4$, $Pb(C_6H_5)_4$, $Pb(CH_2)_3OCH_2C(CH_3)_3$, $Pb(thd)_2$ and the like. A strontium-based material gas may be, for example, $SrCl_2$, $Sr(C_2H_5)_2$, $Sr(C_5(CH_3)_5)_2$, $Sr(thd)_2$ and the like. A barium-based material gas may be, for example, $BaCl_2$, $Ba(C_2H_5)_2$, $Ba(C_5(CH_3)_5)_2$, $Ba(thd)_2$ and the like. A titanium-based material gas may be, for example, $TiCl_4$, $Ti(C_5H_5)Cl_2$, $Ti(OCH_3)_4$, $Ti(OC_2H_5)_4$, $Ti(O-i-C_3H_7)_4$, $Ti(O-n-C_3H_7)_4$, $Ti(O-n-C_4H_9)_4$, $Ti(O-t-C_4H_9)_4$, $Ti(O-n-C_5H_{11})_4$, $Ti(thd)_2$, $TiCl_2(thd)_2$ and the like. A niobium-based material gas may be, for example, $NbCl_5$, $Nb(C_5H_5)Cl_5$, $Nb(OCH_3)_5$, $Nb(OC_2H_5)_5$, $Nb(O-n-C_3H_7)_5$, $Nb(O-i-C_3H_7)_5$, $Nb(O-t-C_4H_9)_5$, $Nb(O-n-C_5H_{11})_5$ and the like. A tantalum-based material gas may be, for example, $TaCl_5$, $Ta(C_5H_5)Cl_5$, $Ta(OCH_3)_5$, $Ta(OC_2H_5)_5$, $Ta(O-n-C_3H_7)_5$, $Ta(O-i-C_3H_7)_5$, $Ta(O-n-C_4H_9)_5$, $Ta(O-t-C_4H_9)_5$, $Ta(O-n-C_5H_{11})_5$ and the like. Here, "thd" represents $((CH_3)_3CCO)_2CH$. Among these, when the $Bi_4Ti_3O_{12}$ film is to be formed, it is preferable to use a combination of $Bi(o-C_7H_7)_3$ and $Ti(i-OC_3H_7)_4$. Although a mixture of these material gases or a mixture of the material gases and the oxygen-containing gas may be used, it is preferable to use them independently in a state of a single gas.

Each of these material gases or the mixture material gases may be used together with a carrier gas. At this time, pressure in forming the film, total flow rate of the used gases, flow rate of the carrier gas and flow rate of the oxygen-containing gas may be maintained constant or may be suitably varied. For example, the flow rate of each of the material gases may be suitably adjusted depending on the size of the film-forming apparatus, the thickness of the film to be formed and the like, and is preferably about 100 to 700 sccm.

The oxygen-containing gas may be used at a flow rate of 20 to 40 vol % or 60 to 80 vol % of the total flow rate of the used gases. Namely, by using the oxygen-containing gas with the flow rate being in the above range, the obtained bismuth-based layered compound is formed to have a composition which is shifted from a stoichiometric composition ratio, and the orientation thereof can be controlled.

In forming the bismuth-based layered compound thin film, the film-forming temperature is preferably 600° C. or less, more preferably in the range of 400° C. to 450° C. Further, the thickness of the bismuth-based layered compound thin film preferably may be larger than that of the above-mentioned bismuth oxide polycrystal thin film and may be about 200 nm or less.

It seems that the above-described ferroelectric thin film and the manufacturing method thereof according to the present invention is more effective with regard to the simplicity of a buffer layer structure and the film-forming process as compared with the three-step growth method developed by the inventors of the present invention and referred to in the description of related arts. The buffer layer formed of bismuth oxide polycrystal thin film may be effective not only for a formation of bismuth titanate thin film but also for a low-temperature process for forming the above-described bismuth-based layered compound thin film having a similar layered perovskite structure such as $SrBi_2(Ta_{1-x}Nb_x)O_9$.

The ferroelectric thin film as described above can be used as a capacitor element or a ferroelectric non-volatile memory element. In this case, the capacitor element or the ferroelectric non-volatile memory element can be fabricated by successively forming a ferroelectric thin film as mentioned above and an upper electrode layer on a substrate provided with a lower electrode layer composed of an electrically conductive thin film.

The material for the substrate to be used in the present invention may be any material as long as it can be generally used as a substrate for a semiconductor device or an integrated circuit. For example, the substrate may be a semiconductor substrate of silicon and the like, a compound semiconductor substrate of GaAs, InPGa and the like, an oxide crystal substrate of MgO and the like, a sapphire substrate, a glass substrate, a dielectric substrate of $SrTiO_3$, $BaTiO_3$, $PbTiO_3$ and the like, and may be selected in accordance with the type and use of a device to be fabricated. Among these, a silicon substrate is preferable.

The lower electrode layer provided on the substrate may be formed, for example, as a lower electrode of the capacitor and is made of an electrically conductive thin film which is generally used for an electrode. The material for the lower electrode may be any material as long as it can withstand a film-forming process when a ferroelectric thin film is formed at a later step. Examples of the material for the lower electrode include Ta, Ti, Pt, Pt/Ti, Pt/Ta and the like. The film thickness of the lower electrode is not specifically limited and may be appropriately adjusted in accordance with the size and the like of the device to be formed. The lower electrode layer may be formed, for example, by employing a conventional method such as the sputtering method, the vapor deposition method and the like. The lower electrode layer may be formed on a substrate directly or on a substrate provided with one or more of a dielectric film, an adhesive layer, a lower wiring, a desired element, an interlayer dielectric film and the like.

Further, an upper electrode layer is formed on the ferroelectric thin film. The upper electrode layer may be formed, for example, as an upper electrode of a capacitor. The material of the upper electrode and the method for forming the upper electrode are as described above. A desired wiring forming process and dielectric film forming process are then performed on the electrode layer to complete the ferroelectric capacitor element.

The above-mentioned ferroelectric thin film may be used in an integrated circuit as a component of a ferroelectric device or a semiconductor device in addition to a capacitor element. For example, the ferroelectric element may be used as a capacitance section of a non-volatile memory. Alternatively, the ferroelectric element may be applied to a gate section of FET and combined with a gate electrode, a gate dielectric film, source/drain regions and the like for use as an MFMIS-FET, an MFS-FET and the like.

Hereafter, the ferroelectric thin film, the manufacturing method thereof and the ferroelectric thin film element according to the present invention are described in detail by way of examples.

Example 1: Film characteristics according to film-forming temperature of a bismuth oxide polycrystal thin film which is a buffer layer FIG. 1 shows a capacitor element which can utilize the ferroelectric thin film of the present invention. The capacitor element includes a thermal oxide film 2 of $SiO_2$, a Ta film 3 which is an adhesive layer, and a lower electrode layer 4 of Pt formed successively on a silicon substrate 1. A ferroelectric film made of a bismuth oxide polycrystal thin film constituting a buffer layer 5 and a bismuth-based layered compound thin film 6 is formed on the lower electrode layer 4.

Hereafter, the method for forming the buffer layer 5 in the ferroelectric thin film to be applied to the above capacitor element is explained.

First, a Pt/Ta/SiO$_2$/Si substrate was fabricated.

After a thermal oxide film 2 of $SiO_2$ having a film thickness of 200 nm was formed by thermal oxidation of a silicon wafer surface constituting the silicon substrate 1, a Ta film 3 having a film thickness of 30 nm and successively a lower electrode layer 4 of Pt having a film thickness of 200 nm were formed by a conventional sputtering method. Here, the Ta film 3 was used as an adhesive layer for the thermal oxide film 2 and the lower electrode layer 4.

Then, a bismuth oxide polycrystal thin film was formed at a substrate temperature of 300° C., 350° C., 400° C. and 450° C., respectively, by a MOCVD method as a buffer layer 5 on the obtained Pt/Ta/SiO$_2$/Si substrate.

As a Bi material, triorthotolylbismuth $Bi(o-C_7H_7)_3$ was used. The bismuth oxide polycrystal thin film was formed by vaporizing the Bi material at a temperature of 160° C. and supplying an Ar gas (300 sccm) used as a carrier gas and an oxygen gas (1300 sccm) used as a reaction gas onto the surface of the above-mentioned substrate positioned in the film-forming chamber. Where the Ar gas is used in this manner, it is considered on calculation that $Bi(o-C_7H_7)_3$ is consumed at about $2.7 \times 10^{-6}$ mol/min.

Here, if the pressure within the film-forming chamber at the time of forming the film is 10 Torr or more, the Bi material gas condenses by gas phase reaction before reaching the substrate surface, whereby particles are generated. Therefore, the pressure was maintained at 5 Torr. Also, the flow amount and the flow rate of the used gases must be adjusted in order to form a uniform thin film on the entire surface of the substrate. Therefore, in forming the bismuth oxide polycrystal thin film, an Ar gas was simultaneously supplied at a flow rate of 900 sccm as a balance gas for adjusting the total flow rate of the used gases in addition to a combination of the Ar carrier gas containing the Bi material gas and the oxygen gas used as the reaction gas so that the total gas flow rate was 2500 sccm. The period of time for forming the film was 30 minutes for each substrate temperature and the film thickness was about 100 nm.

Figure 2:
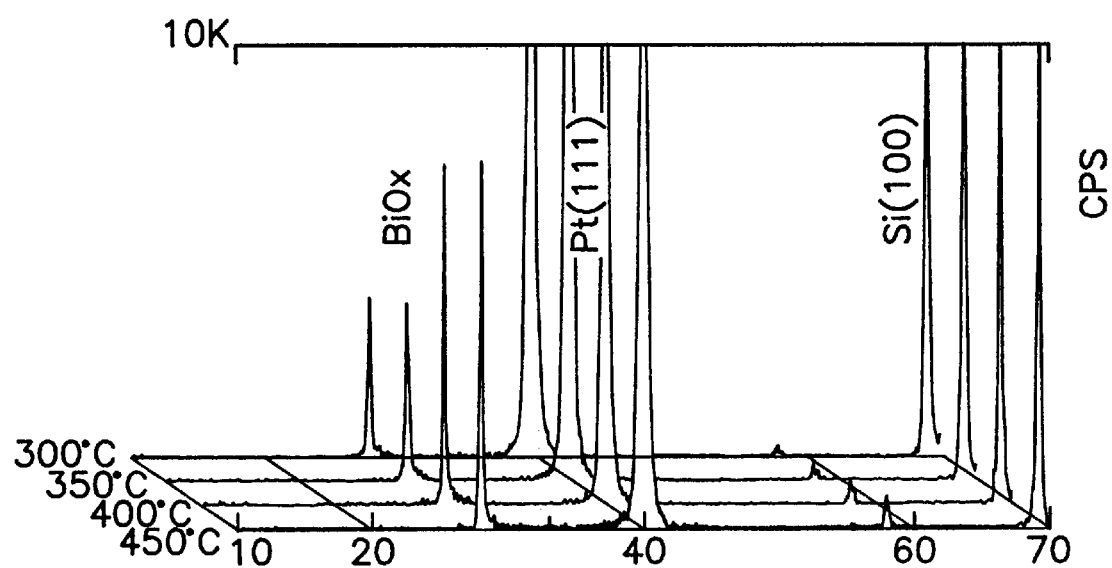
FIG. 2 is a view illustrating XRD patterns of buffer layers formed of bismuth oxide polycrystal thin film according to an embodiment of the present invention.

FIG. 2 shows an X-ray diffraction pattern (XRD pattern) of the bismuth oxide polycrystal thin film formed in the above manner. Referring to FIG. 2, it was confirmed that all of the bismuth oxide polycrystal thin films formed at respective substrate temperatures showed a diffraction peak near 28°, which showed that the films had been crystallized. Further, the intensity of the diffraction peak increased in accordance with the rise of the substrate temperature, and especially, a sharp increase is observed at 350° C. to 400° C.

Figure 3A:
FIGS. 3(a) and 3(b) are photographs illustrating a surface morphology of each of the buffer layers shown in FIG. 2.
Figure 3B:
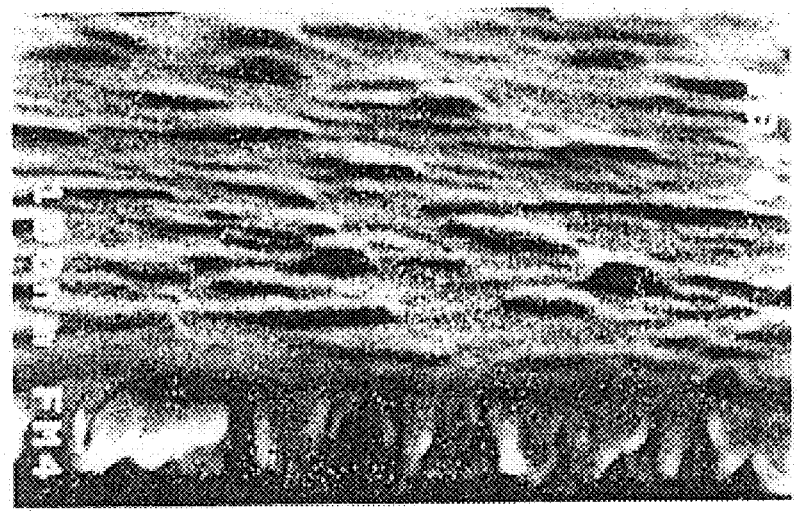
Figure 4A:
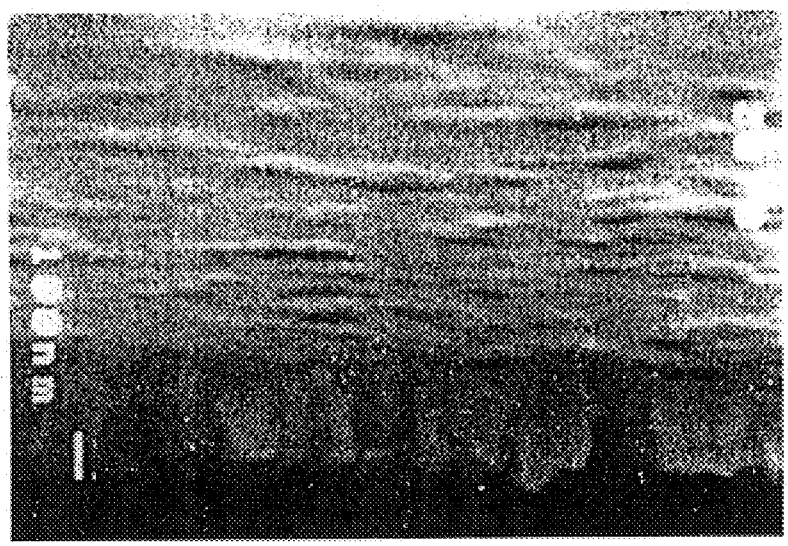
FIGS. 4(a) and 4(b) are photographs illustrating a surface morphology of each of the buffer layers shown in FIG. 2.
Figure 4B:
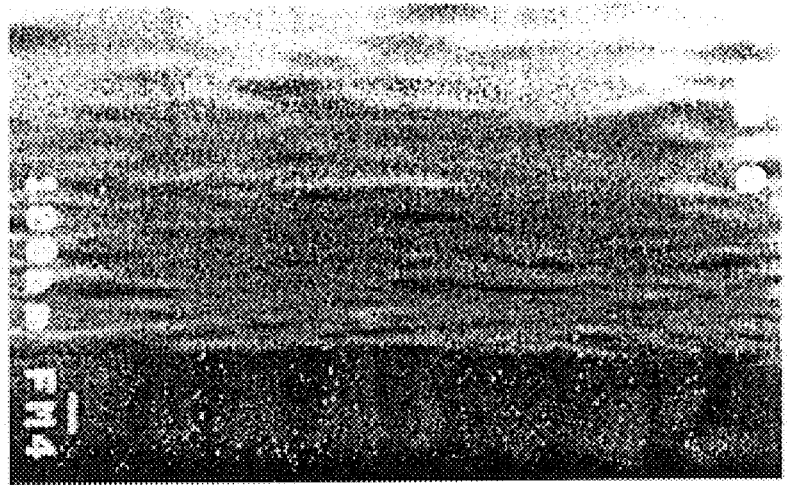

FIGS. 3(*a*) to 4(*b*) are photographs taken by a scanning electron microscope (SEM) showing a surface morphology of each of the bismuth oxide polycrystal thin films obtained as above. From these photographs, it is understood that the surface of the thin film is flat at a substrate temperature of 350° C. or less, whereas a surface roughness (unevenness) gradually begins to be observed according as the substrate temperature rises, for example, to 400° C. and to 450° C. This shows that the crystallinity increases sharply at those temperatures. Namely, crystal granules grow according as the substrate temperature rises, so that the intensity of XRD diffraction peak increases, thereby generating the surface roughness.

As a result, it has been confirmed that the bismuth oxide polycrystal thin film is sufficiently crystallized even at a low temperature of 400° C. or less.

Example 2: Film structure of ferroelectric thin film according to the presence or absence of the bismuth oxide polycrystal thin film constituting the buffer layer A bismuth oxide polycrystal thin film was formed to a film thickness of about 20 nm as a buffer layer 5 in the same manner as in the Example 1 except that the film was formed on a surface of a Pt/Ta/SiO$_2$/Si substrate at a substrate temperature of 400° C. for 10 minutes.

Subsequently, a bismuth titanate thin film constituting the bismuth-based layered compound thin film 6 was formed on the buffer layer 5. As the Bi material, triorthotolylbismuth Bi(o—C$_7$H$_7$)$_3$ was vaporized at a temperature of 160° C. in the same manner as in the Example 1 and was used with an Ar carrier gas at 300 sccm. As the Ti material, titanium tetraisopropoxide Ti(i—OC$_3$H$_7$)$_4$ was vaporized at a temperature of 50° C. in the same manner and was used with an Ar carrier gas supplied at 65 sccm and an O$_2$ gas supplied at 1300 sccm and, further, the flow rate of Ar gas for balance was adjusted so that the total gas flow rate was 2500 sccm. Where the Ar gas is used in this manner, it is considered on calculation that Ti(i—OC$_3$H$_7$)$_4$ is consumed at about 2.0× $10^{-6}$ mol/min. The bismuth titanate thin film was formed for one hour and the film thickness was about 100 nm (sample A).

As a comparative example, a bismuth titanate thin film was formed under the same condition but without the buffer layer of bismuth oxide polycrystal thin film (sample B).

Figure 5A:
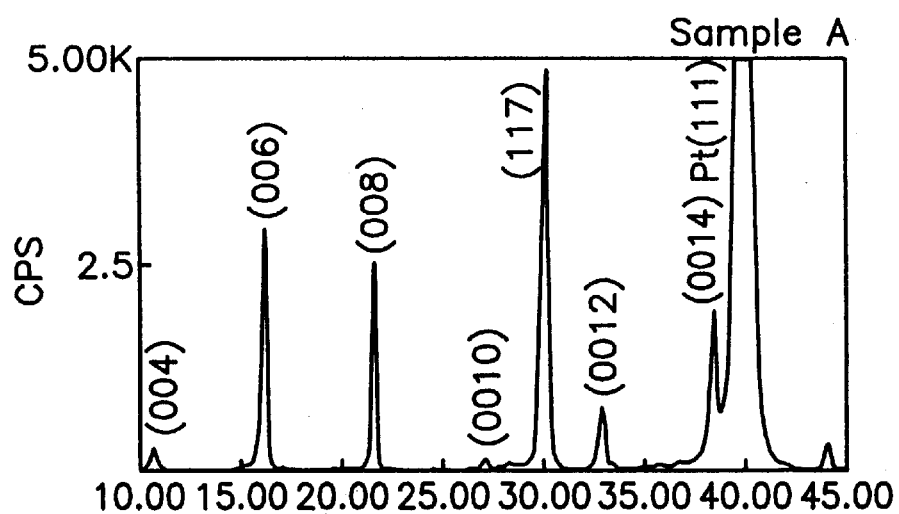
FIGS. 5(a), 5(b), and 5(c) are views illustrating XRD patterns of ferroelectric thin films after a bismuth titanate thin film is formed according to the embodiment of the present invention.
Figure 5B:
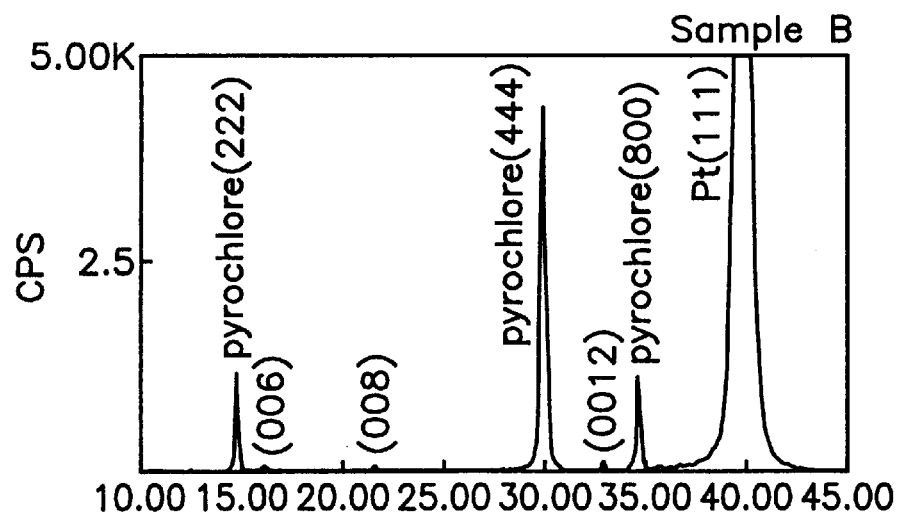

FIGS. 5(a) and 5(b) show XRD patterns of these samples A and B. As a result of this, it is understood that a crystal thin film was obtained for each of the samples A and B although the substrate temperature was as low as 400° C. However, it is observed that, while a diffraction peak of a single-phase Bi$_4$Ti$_3$O$_{12}$ of layered perovskite structure was clearly obtained in the case of the bismuth titanate thin film of the sample A using the buffer layer 5, the sample B without the buffer layer 5 mainly showed a diffraction peak of Bi$_2$Ti$_2$O$_7$ having a pyrochlore structure with very small diffraction peak intensity by Bi$_4$Ti$_3$O$_{12}$.

In order to investigate the cause of this difference, the composition of each of the obtained films was analyzed by EPMA. As a result of this, it was found that Bi/Ti was 1.32 in the sample A having a buffer layer, whereas Bi/Ti was 1.04 in the sample B without the buffer layer. In other words, the sample A having a buffer layer had a composition rich in Bi because of the existence of the buffer layer of bismuth oxide polycrystal thin film. This corresponds well to the fact that the above XRD patterns for the respective films are different. Also, the Bi/Ti composition ratios of these samples A and B are almost identical to the stoichiometric composition ratios 1.33 of Bi$_4$Ti$_3$O$_{12}$ and 1.0 of Bi$_2$Ti$_2$O$_7$, respectively. This seems to show that XRD patterns corresponding to the respective crystal structures were obtained.

Therefore, if the film composition is allowed to be Bi/Ti= 1.33 even in a sample without the buffer layer, there is a possibility of obtaining a thin film which shows a diffraction pattern of Bi$_4$Ti$_3$O$_{12}$ in the same manner as in the case of the sample A with the bismuth oxide buffer layer. In order to confirm this, a thin film was formed by increasing the flow rate of the carrier gas for the Bi material to 350 sccm and maintaining the other conditions to be the same as those of the above comparative example (sample B without the buffer layer). Sample C is the thin film obtained as a result of the above process.

Figure 5C:
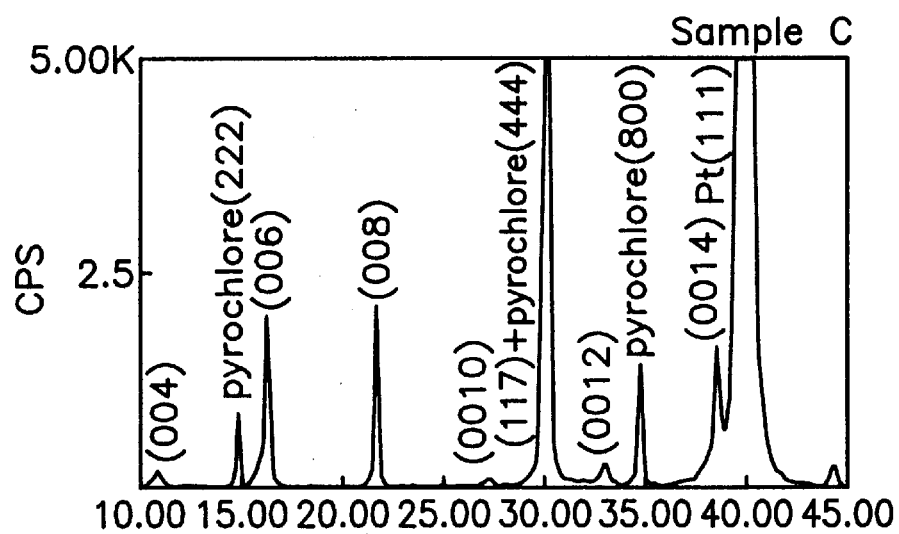

The EPMA analysis shows that the sample C has a composition ratio of Bi/Ti=1.31. However, according to the XRD pattern shown in FIG. 5(c), it is understood that the sample C still shows a main diffraction peak of Bi$_2$Ti$_2$O$_7$ having a pyrochlore structure, although the diffraction peak intensity of Bi$_4$Ti$_3$O$_{12}$ has clearly increased as compared with the XRD pattern of bismuth titanate of the sample B having a composition ratio of Bi/Ti=1.04 without the buffer layer.

As is clearly understood from the above result, it is essential to use a buffer layer of bismuth oxide polycrystal thin film in crystallizing Bi$_4$Ti$_3$O$_{12}$ having a layered perovskite structure at a low temperature.

Further, the XRD pattern of the sample A using the buffer layer of bismuth oxide polycrystal thin film in FIG. 5(a) does not show an XRD diffraction pattern corresponding to a bismuth oxide polycrystal thin film. This seems to show that, when the bismuth titanate film grows, the bismuth oxide polycrystal thin film and the bismuth titanate thin film undergo a solid phase reaction, whereby the entire thin film including the bismuth oxide polycrystal thin film has grown to be a Bi$_4$Ti$_3$O$_{12}$ film corresponding to the Bi/Ti composition ratio. This clearly shows that, in the end, the bismuth oxide polycrystal thin film disappears.

Figure 6A:
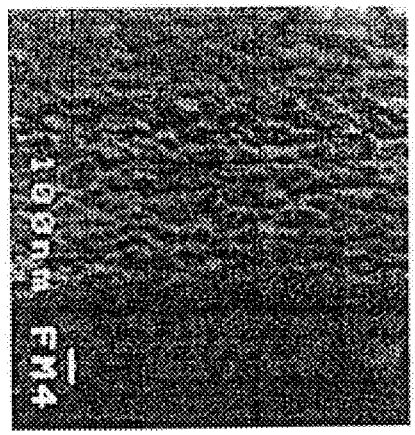
FIGS. 6(a) and 6(b) are photographs illustrating a surface morphology of bismuth titanate thin films according to the embodiment of the present invention.
Figure 6B:
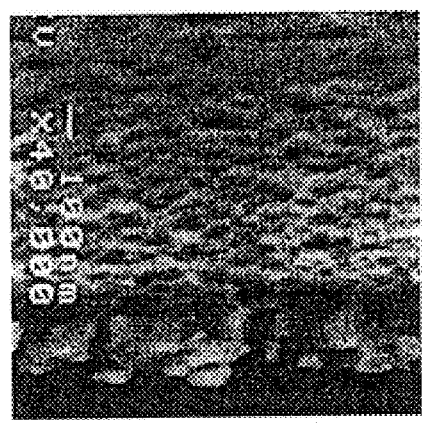

Next, surface morphologies of the above samples A and C were compared. FIGS. 6(a) and 6(b) show surface SEM photographs of the samples A and C, respectively. These photographs show that both of the samples have a grain size which is as small as about 20 to 50 nm and good surface flatness. This seems to be because increase in the size of crystal grain was suppressed by forming the film at a low temperature of 400° C. Also, in the sample A, it is shown that the surface morphology of the buffer layer made of the bismuth oxide polycrystal thin film gives only a small difference on the surface morphology of the upper thin film made of bismuth titanate.

This clearly shows that, in the case where the bismuth oxide buffer layer 5 is formed, it is extremely effective in realizing a single-phase Bi$_4$Ti$_3$O$_{12}$ thin film (having a layered perovskite structure) at a low substrate temperature of 400° C.

Example 3: Orientation of Bi$_4$Ti$_3$O$_{12}$ thin film crystal according to the change in the Bi/Ti composition ratio of bismuth titanate thin film which is a bismuth-based layered compound thin film A Pt/Ta/SiO$_2$/Si substrate was used as the substrate in the same manner as in the Example 1.

Also, a buffer layer of bismuth oxide polycrystal thin film was formed on the substrate in the same manner as in the Example 1. Namely, Bi(o-C$_7$H$_7$)$_3$ was vaporized at a temperature of 160° C. as the Bi material and was used with an Ar carrier gas supplied at 300 sccm, an O$_2$ gas supplied at 1300 sccm and an Ar gas for balance supplied at 900 sccm onto the substrate to form the film for 10 minutes.

Subsequently, a bismuth titanate thin film was formed to a thickness of 100 nm on the buffer layer under the following condition. Namely, the substrate temperature was maintained at 400° C.; a Bi material gas was used at a flow rate of 250 sccm or 350 sccm; a Ti material was vaporized to a temperature of 50° C.; an Ar carrier gas was used at 65 sccm; and the flow rate of the total used gases including an O$_2$ gas and an Ar gas for balance was maintained at a constant value of 2500 sccm.

Figure 7A:
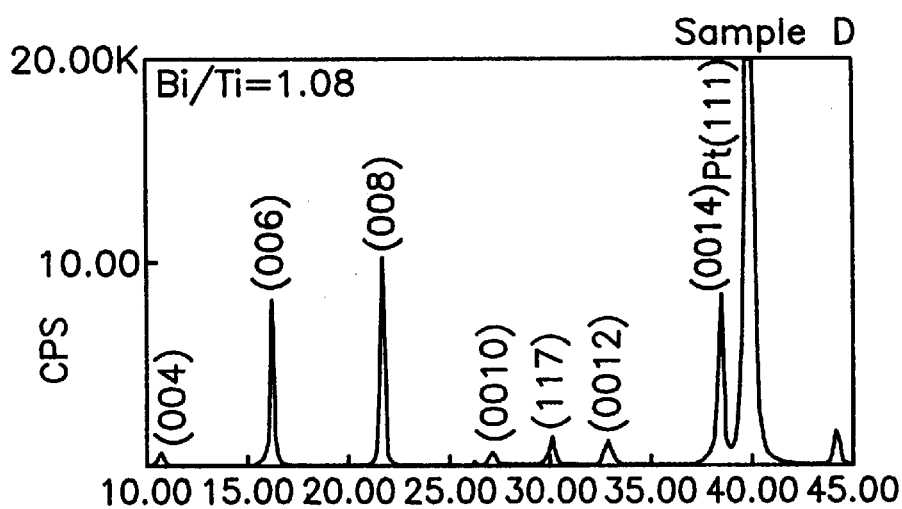
FIGS. 7(a) and 7(b) are views illustrating XRD patterns of ferroelectric thin films after a bismuth titanate thin film is formed according to another embodiment of the present invention.
Figure 7B:
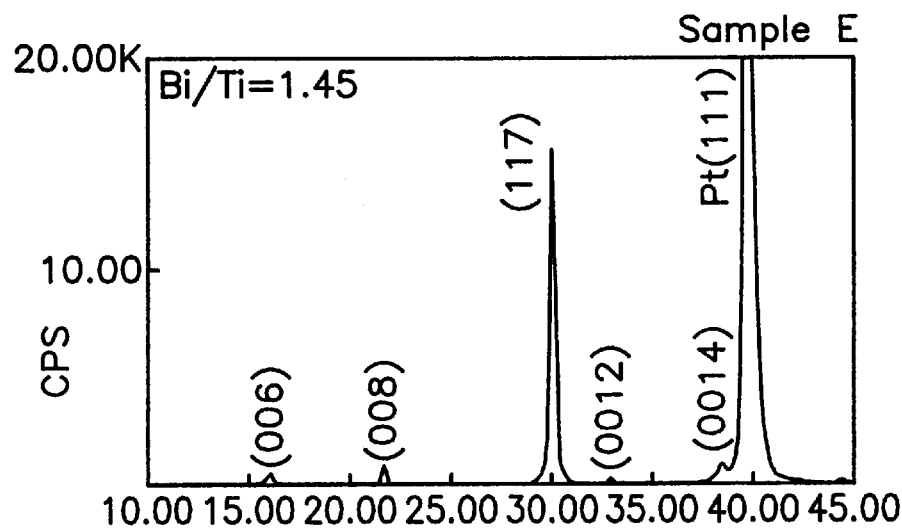

The Bi/Ti composition ratio of the obtained film was 1.08 (in the sample D) when the flow rate of the Bi material gas was 250 sccm, and was 1.45 (in the sample E) when the flow rate of the Bi material gas was 350 sccm. FIGS. 7(a) and 7(b) show XRD patterns of the respective thin films.

All of the observed diffraction peaks correspond to Bi$_4$Ti$_3$O$_{12}$ having a layered perovskite structure. Also, it is understood that the orientation changes in accordance with the difference in the Bi/Ti composition ratio.

Namely, in the case of the sample D where the Bi/Ti composition ratio is smaller than the stoichiometric composition ratio of Bi/Ti=1.33, a film is obtained with a c-axis predominant orientation having (00r) reflections (where r is an even integer), which are clearly c-axis orientation components, as major reflections, as shown in FIG. 7(a). On the other hand, in the case of the sample E where the Bi/Ti composition ratio is larger than the stoichiometric composition ratio, the intensity of the (117) reflection increases and the other reflection peaks are very small, as shown in FIG. 7(b). This shows that the thin film of the sample E is a film where the (117) orientation is predominant. Since the (117) orientation includes a component in the a-axis direction which is a direction in which the spontaneous polarization of $Bi_4Ti_3O_{12}$ is large, the thin film of the sample E can be expected to exhibit a larger spontaneous polarization than the thin film (Bi/Ti=1.32) prepared in the Example 2 and exhibiting a random orientation.

Figure 8A:
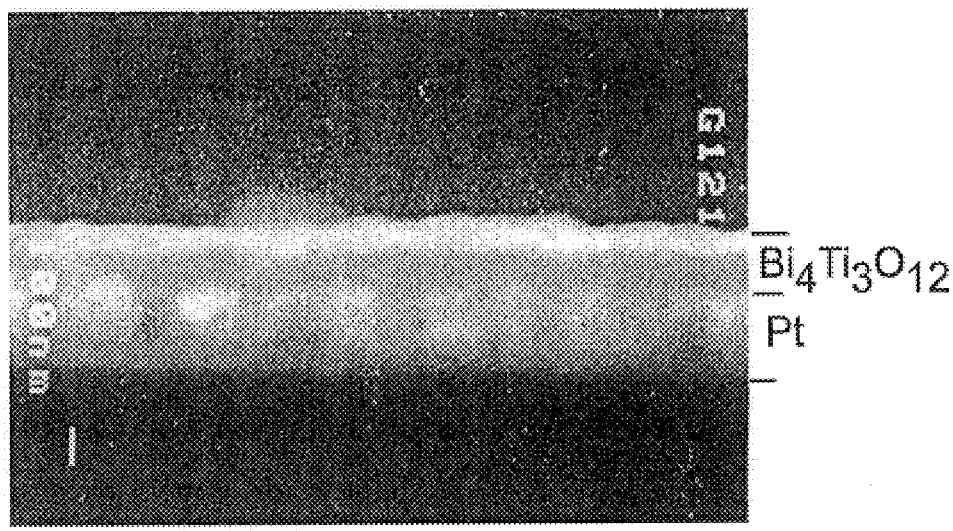
FIGS. 8(a) and 8(b) are photographs illustrating a surface morphology of the ferroelectric thin films shown in FIGS. 7(a) and 7(b)
Figure 8B:
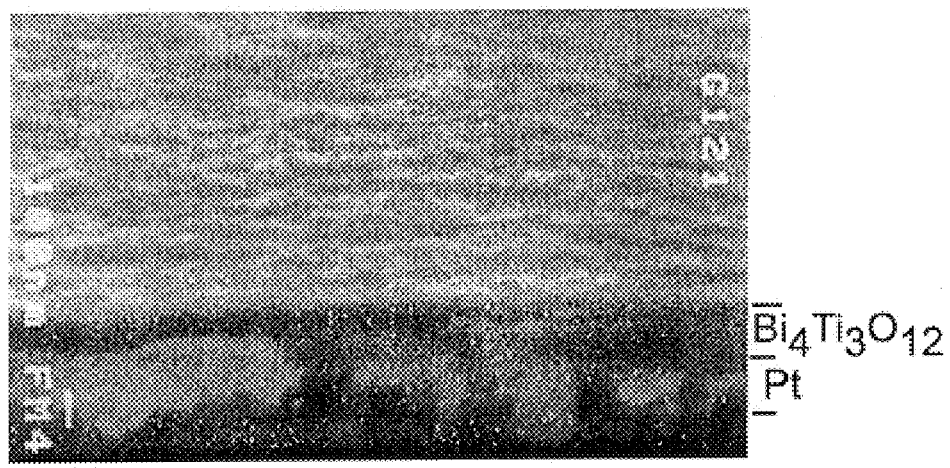
Figure 9A:
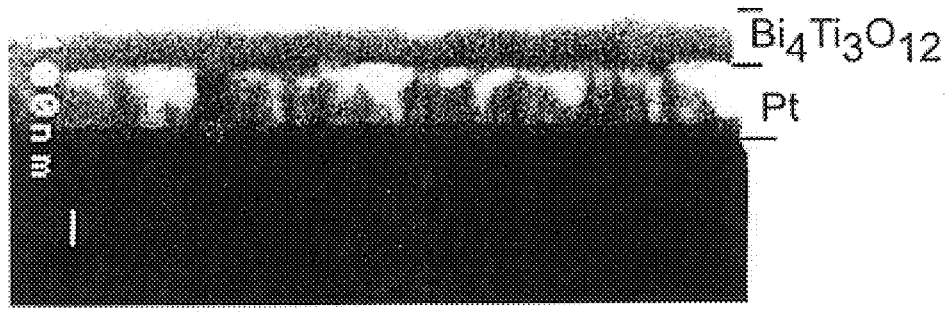
FIGS. 9(a) and 9(b) are photographs illustrating a surface morphology of the ferroelectric thin films shown in FIGS. 7(a) and 7(b)
Figure 9B:
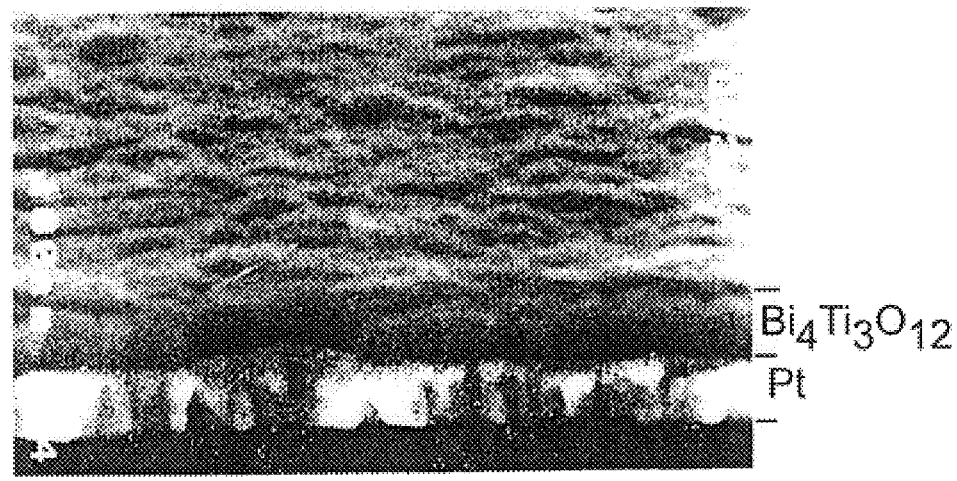

FIGS. 8(a), 8(b) and 9(a), 9(b) are SEM photographs showing film surface morphologies of the sample D (film with c-axis predominant orientation) and the sample E (film with (117) predominant orientation), respectively. In these Figures, FIG. 8(a) and FIG. 9(a) shows a cross section of the ferroelectric thin film formed on the lower electrode layer and FIG. 8(b) and FIG. 9(b) shows a perspective view.

An upper electrode layer was formed with Pt having a diameter of 100 $\mu$m and a thickness of 100 nm by vapor deposition on the samples D and E obtained as above to form a ferroelectric capacitor, and the ferroelectric properties were measured by using these ferroelectric capacitors.

Figure 10A:
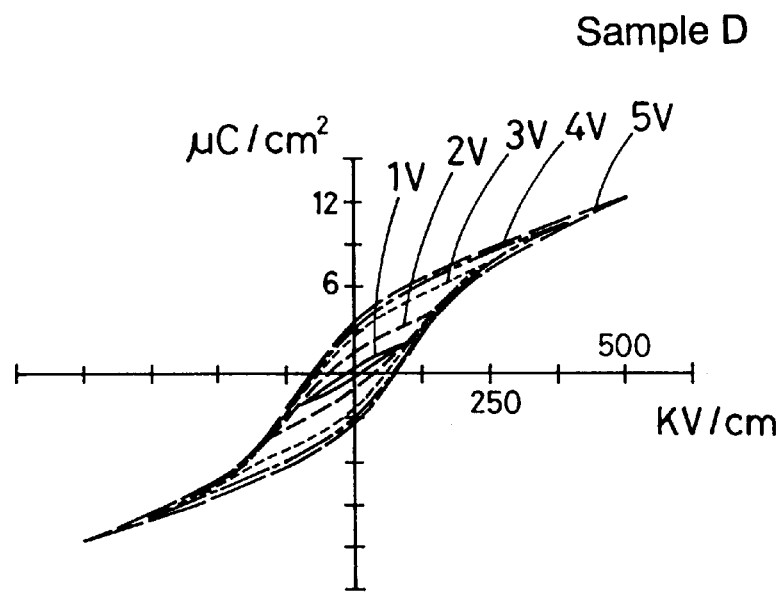
FIGS. 10(a) and 10(b) are views illustrating a hysteresis of ferroelectric thin films shown in FIGS. 7(a) and 7(b)
Figure 10B:
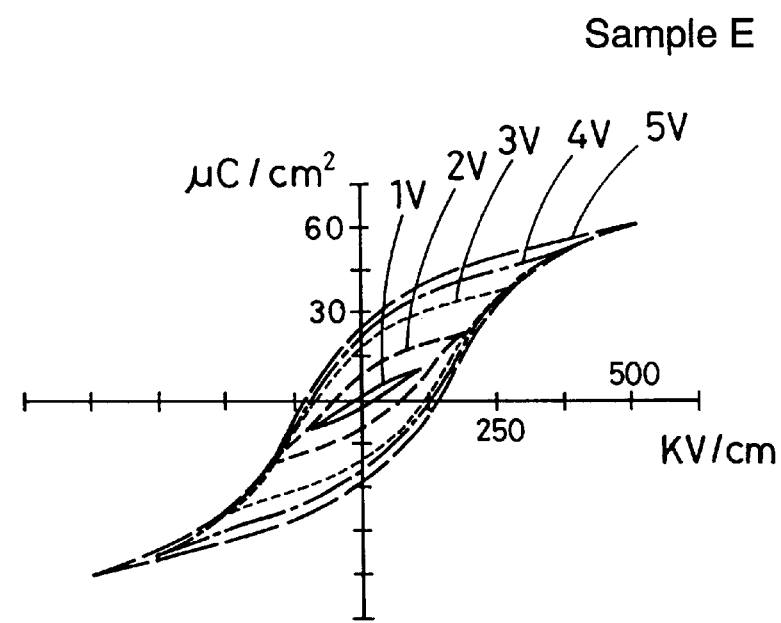

FIGS. 10(a) and 10(b) shows hysteresis curves of the samples D and E, respectively. This shows that the film of the sample D with c-axis predominant orientation has a remanent polarization of Pr=2.8 $\mu C/cm^2$, a coercive field of Ec=51 kV/cm and a leak current density of $I_L$=6×10$^{-9}$ $\mu A/cm^2$ when 3V is applied, and has a remanent polarization of Pr=3.2 $\mu C/cm^2$, a coercive field of Ec=60 kV/cm and a leak current density of $I_L$=3×10$^{-8}$ $\mu A/cm^2$ when 5V is applied.

On the other hand, the film of the sample E with (117) predominant orientation has a remanent polarization of Pr=20 $\mu C/cm^2$, a coercive field of Ec=90 kV/cm and a leak current density of $I_L$=1×10$^{-8}$ $\mu A/cm^2$ when 3V is applied, and has a remanent polarization of Pr=23 $\mu C/cm^2$, a coercive field of Ec=100 kV/cm and a leak current density of $I_L$=8×10$^{-8}$ $\mu A/cm^2$ when 5V is applied, From this, it is understood that the film of the sample D with c-axis predominant orientation and the film of the sample E with (117) predominant orientation both show good saturation properties where the polarization is saturated at an applied voltage of 3V or more.

Figure 11A:
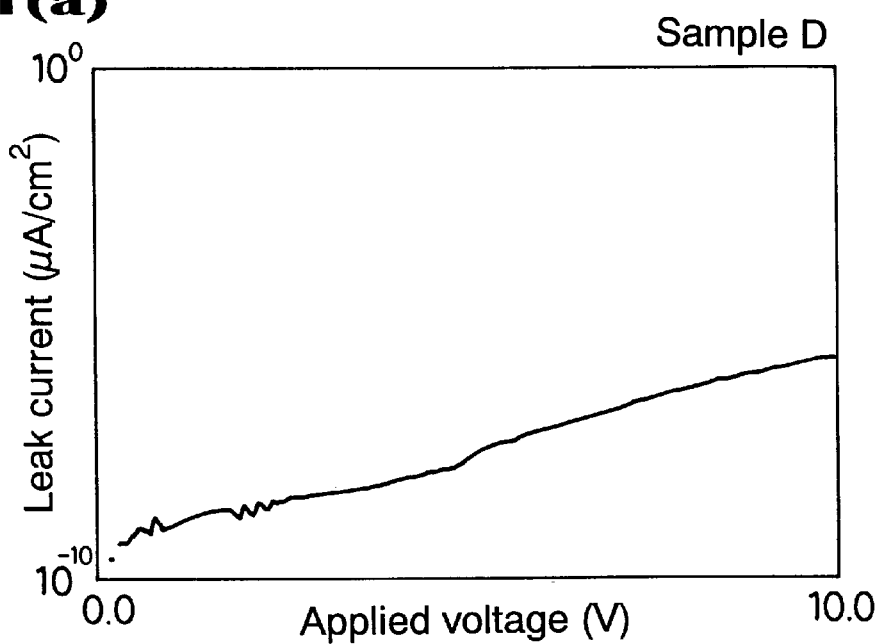
FIGS. 11(a) and 11(b) are views illustrating a leak current of ferroelectric thin films shown in FIGS. 7(a) and 7(b)
Figure 11B:
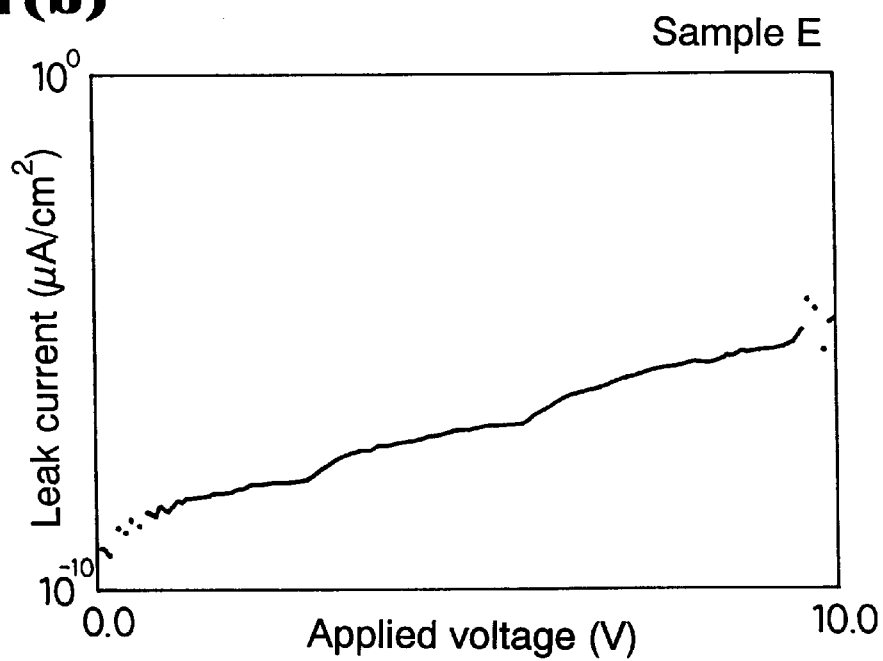

FIGS. 11 (a) and 11 (b) show leak current properties. These show that the sample D has a leak current density of $I_L$=6×10$^{-9}$ $\mu A/cm^2$ when 3V is applied, and a leak current density of $I_L$=3×10$^{-8}$ $\mu A/cm^2$ when 5V is applied. On the other hand, the sample E has a leak current density of $I_L$=1×10$^{-8}$ $\mu A/cm^2$ when 3V is applied, and a leak current density of $I_L$=8×10$^{-8}$ $\mu A/cm^2$ when 5V is applied.

From these, it is understood that the film of the sample D with c-axis predominant orientation and the film of the sample E with (117) predominant orientation both show very good leakage properties.

Thus, in the present invention, the orientation can be changed effectively by changing the Bi/Ti composition ratio in the bismuth titanate thin film. Therefore, it is possible to separately fabricate a thin film having a large spontaneous polarization component along the a-axis which $Bi_4Ti_3O_{12}$ originally has and a thin film having a small coercive field component along the c-axis, whereby ferroelectric properties suitable for the intended device can be obtained.

Now, when thin films having a Bi/Ti composition ratio other than those described above are evaluated, the following is shown. If the Bi/Ti composition ratio is about 1.0 or less, $Bi_2Ti_2O_7$ having a pyrochlore structure which is an ordinary dielectric substance begins to be generated. On the other hand, if the Bi/Ti composition ratio exceeds 1.5, bismuth oxide begins to be mingled in addition to $Bi_4Ti_3O_{12}$. Therefore, it is understood that it is preferable to control the Bi/Ti composition ratio within the range of 1.0 to 1.5.

Example 4: Orientation of the $Bi_4Ti_3O_{12}$ thin film crystal when only the ratio of $O_2$ gas in the material gas is changed at the time of forming the film with the Bi/Ti composition ratio in the bismuth titanate thin film being maintained at the stoichiometric composition ratio In order to obtain a desired orientation in the above Example 3, it is necessary to change the amount of the Bi and Ti material gases to be supplied, so that the Bi/Ti composition ratio of the thin film is shifted from the stoichiometric composition ratio of $Bi_4Ti_3O_{12}$. Therefore, excess atoms which are not incorporated in the crystal lattice exist and these excess atoms form a lattice defect in the thin film crystal, raising a possibility that an undesired influence is given to the thin film material properties. Accordingly, in this Example, an explanation is given to show that the orientation can be changed with the Bi/Ti composition ratio in the thin film being maintained at the stoichiometric composition ratio by changing only the ratio of the $O_2$ gas in the material gases while maintaining the supplied amount of the Bi and Ti material gases to be constant in forming the thin film by the MOCVD method.

A Pt/Ta/SiO$_2$/Si substrate was used as the substrate in the same manner as in the Example 1 to form a buffer layer of bismuth oxide polycrystal thin film similar to the Example 1. Then, a bismuth titanate thin film was formed substantially in the same manner as in the Example 1 except that the ratio of the flow rate of the $O_2$ gas relative to the flow rate of the total used gases is changed. Namely, a film was formed with the $O_2$ gas flow rate of 900 sccm (36% of the flow rate of the total used gases) to prepare a sample F, and another film was formed with the $O_2$ gas flow rate of 1500 sccm (60% of the flow rate of the total used gases) to prepare a sample G.

The Bi/Ti composition ratio of each of the samples F and G prepared under the above film-forming condition was measured. The result showed that the Bi/Ti composition ratio was 1.28 for the sample F and 1.35 for the sample G, each of which was near the stoichiometric composition ratio of 1.33 in $Bi_4Ti_3O_{12}$.

Figure 12A:
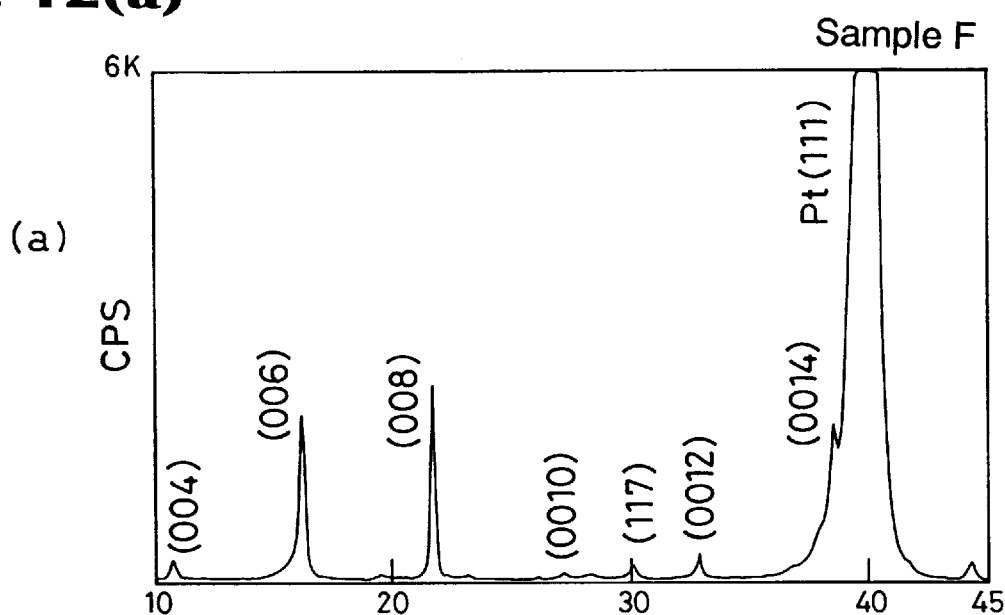
FIGS. 12(a) and 12(b) are views illustrating XRD patterns of ferroelectric thin films after a bismuth titanate thin film is formed according to still another embodiment of the present invention.
Figure 12B:
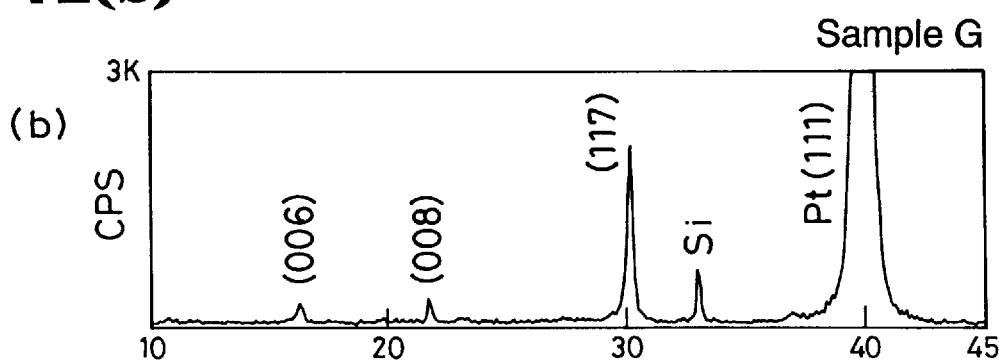

Also, XRD patterns for the samples F and G were measured. FIGS. 12(a) and 12(b) show the XRD patterns obtained by the measurement. It is understood from FIGS. 12(a) and 12(b) that, although each of the XRD patterns shows only a diffraction peak of $Bi_4Ti_3O_{12}$ having a layered perovskite structure, their orientations are quite different. Namely, in the sample F, a film with c-axis predominant orientation is obtained having (00r) reflections (wherein r is an even integer), which are clearly c-axis orientation components, as major reflections. On the other hand, in the sample G, the intensity of (117) reflection is large and the other reflection peaks are very small. This shows that the sample G is a film having a (117) reflection as a major reflection.

The (117) reflection contains a component in the a-axis direction in which the spontaneous polarization of $Bi_4Ti_3O_{12}$ is large, so that the film can be expected to have a larger spontaneous polarization than the thin film exhibiting a random orientation prepared in the Example 1 ($O_2$ gas flow rate ratio=52%).

As explained above, according to the method of the present invention for fabricating bismuth titanate, the orientation of the thin film can be changed effectively by changing the ratio of the flow rate of the supplied $O_2$ gas relative to the flow rate of the total supplied material gases in forming the thin film by the MOCVD method. Also, since the Bi/Ti composition ratio of the thin film is not shifted largely from the stoichiometric composition ratio as in the Example 3, it is possible to suppress the generation of lattice defects in the fabricated bismuth titanate thin film due to the composition shift. Further, the method of the present invention is advantageous in that the variation of the film-forming parameters can be greatly suppressed because it is sufficient to form the film under a condition such that only the amounts of the $O_2$ gas and the Ar gas for balance are changed while maintaining the condition of supplying the Bi and Ti material gases to be constant.

Here, films formed under a different flow ratio of the supplied $O_2$ gas from that of the thin film described above were evaluated. The result showed that, when the flow rate ratio was within the range of 20% to 40%, a $Bi_4Ti_3O_{12}$ thin film mainly having the c-axis orientation as a predominant orientation was obtained. On the other hand, when the flow rate ratio was within the range of 60% to 80%, the (117) orientation was predominant and, when the flow rate ratio was within the range of 40% to 60%, the thin film had a random orientation in which the (117) orientation and the c-axis orientation were both present.

Example 5: Ferroelectric non-volatile memory element

In this example, an explanation is given on a practical case in which the above-mentioned ferroelectric thin film is applied to an electronic device.

Figure 13A:
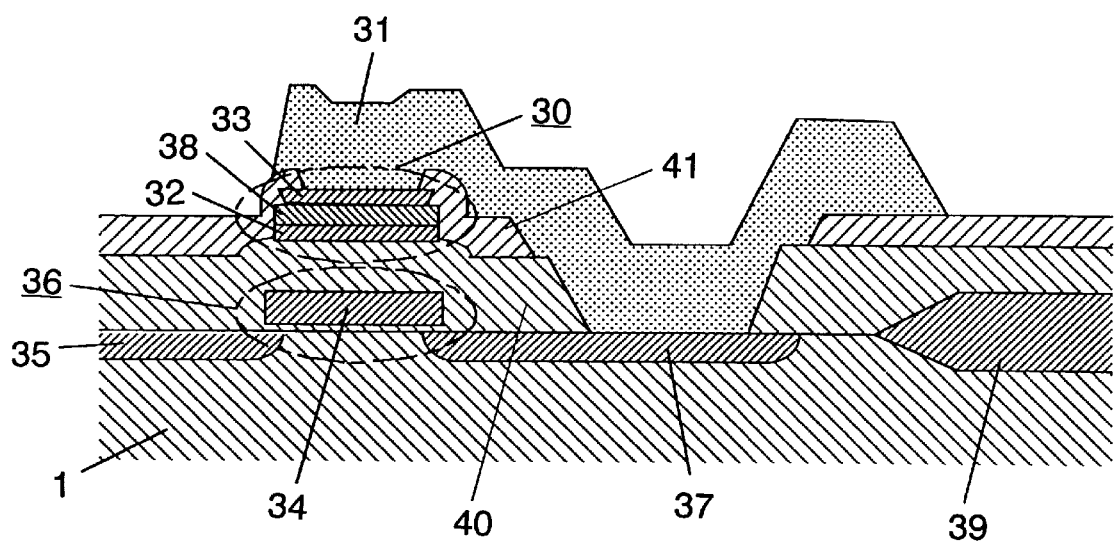
FIGS. 13(a) and 13(b) are a schematic cross-sectional view and a circuit diagram of an essential portion illustrating a non-volatile memory element which is an embodiment of an element including the ferroelectric thin film of the present invention.
Figure 13B:
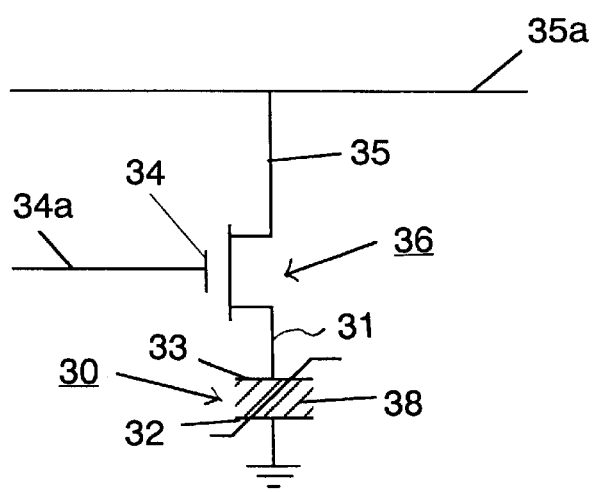

First, FIG. 13 (*a*) shows an example in which the above ferroelectric thin film is applied to a non-volatile memory having a capacitor structure, and FIG. 13(*b*) shows an equivalent circuit thereof. The non-volatile memory having a capacitor structure is constructed with one capacitor 30 and one transistor 36 for selection. The capacitor 30 includes a ferroelectric thin film 38 and a pair of upper and lower electrode layers 33, 32 sandwiching the ferroelectric thin film 38. The transistor 36 includes a source region 35 connected to a bit line 35*a*, a gate electrode 34 connected to a word line 34*a* and a drain region 37 connected to an Al wiring layer 31. The Al wiring layer 31 is also connected to the upper electrode layer 33 of the capacitor 30.

An explanation is now given on a method of fabricating a non-volatile memory having the above-mentioned capacitor structure. First, a field oxide film 39 for device isolation is formed on an n-type Si substrate. Thereafter, the source region 35 and the drain region 37 are formed by the conventional MOS fabrication method, followed by forming a gate dielectric film and the gate electrode 34 to complete the MOS transistor. Further, the surface of the substrate having the transistor formed thereon is covered with PSG (phosphosilicate glass) film 40 as an interlayer dielectric film and is planarized by reflow process.

Then, after the lower electrode layer 32 is formed thereon, the ferroelectric thin film 38 of $Bi_4Ti_3O_{12}$ having a (117) predominant orientation and the upper electrode layer 33 are successively formed. Subsequently, the substrate is covered with PSG film 41 again and subjected to reflow process; then contact holes are formed on the drain region 37 and on the upper electrode layer 33; and finally the Al wiring layer 31 is formed. The ferroelectric thin film of $Bi_4Ti_3O_{12}$ having the (117) predominant orientation is formed because the non-volatile memory having the capacitor structure preferably includes the ferroelectric thin film exhibiting a large spontaneous polarization.

Hereafter, operation of the non-volatile memory having the above-capacitor structure is explained.

In order to write the data "1", a negative voltage pulse larger than the coercive field is applied to the ferroelectric thin film 38 via the selection transistor 36 from the bit line 35*a*. This polarizes the ferroelectric thin film 38, and allows the direction of the spontaneous polarization to be oriented toward the lower electrode layer 32 of the capacitor 30.

On the other hand, in order to write the data "0", a positive voltage pulse larger than the coercive field is applied to the ferroelectric thin film 38 via the selection transistor 36 from the bit line 35*a*. This polarizes the ferroelectric thin film 38, and allows the direction of the spontaneous polarization to be oriented toward the upper electrode layer 33 of the capacitor 30.

In order to read these data, the polarization direction of the ferroelectric thin film 38 is detected. When a positive voltage pulse is applied to the lower electrode layer 32 in a state having the written data of "1", the direction of the spontaneous polarization of the ferroelectric thin film 38 is inverted. At this time, an inversion current accompanying the polarization inversion flows through the capacitor 30.

On the other hand, when a positive voltage pulse is applied to the lower electrode layer 32 in a state having the written data of "0", the direction of the spontaneous polarization of the ferroelectric thin film 38 is not inverted, so that the non-inversion current flowing through the capacitor 30 is smaller than the above inversion current. Therefore, it is possible to determine whether the written data was "1" or "0" by detecting, with a sensing amplifier (not shown) connected to the bit line, the electric current flowing through the ferroelectric thin film 38 at the time of applying the voltage pulse and setting a threshold between the magnitude of the inversion current and the magnitude of the non-inversion current.

Since the state of spontaneous polarization is maintained in the ferroelectrics even if the electric field is cut off, the operation of the non-volatile memory is made possible. Here, with the same structure as mentioned above, the capacitor can be operated at ordinary times as a DRAM by utilizing only the property of having a high dielectric constant in the ferroelectrics. This makes it possible to operate the capacitor as a DRAM at ordinary times and as a non-volatile memory at the time of turning the power off.

Example 6: Ferroelectric non-volatile memory of FET type

In this example, an explanation is given on a MFMIS (Metal Ferroelectric Metal Insulator Semiconductor) structure enabling a non-destructive reading operation by using a ferroelectric thin film in a gate dielectric film of a FET (Field Effect Transistor).

Figure 14:
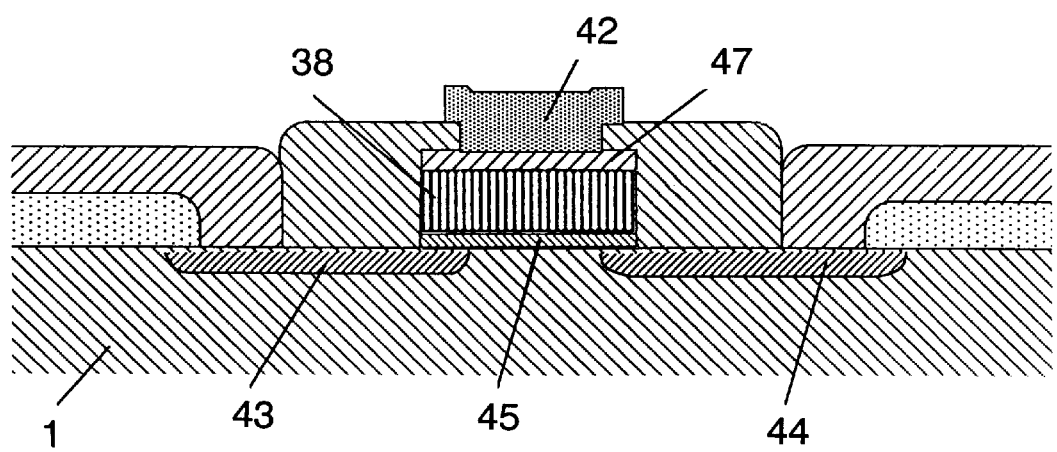
FIG. 14 is a schematic cross-sectional view of an essential portion illustrating a MFMIS-FET which is another embodiment of an element including the ferroelectric thin film of the present invention.

FIG. 14 shows a ferroelectric non-volatile memory of FET type in this example. The ferroelectric non-volatile memory has a structure in which a ferroelectric thin film gate is disposed between a source region 43 and a drain region 44. Here, the ferroelectric thin film gate includes a dielectric film ($SiO_2$) 45 which is in contact with a channel portion of a silicon substrate 1, a ferroelectric thin film ($Bi_4Ti_3O_{12}$) 38 formed thereon, an upper gate 47, and an Al wiring layer 42 connected thereto. Here, a $Bi_4Ti_3O_{12}$ thin film having the c-axis orientation is used as a ferroelectric thin film 38. Also, the gate dielectric film 45 was used because, if the ferroelectric thin film and the silicon substrate were in contact, it would be difficult to control the interface condition.

Next, the operation of the non-volatile memory of FET type is explained.

First, data are written by applying a positive or negative pulse voltage to the upper gate 47 to set the direction of the spontaneous polarization of the ferroelectric thin film 38. Since the spontaneous polarization of the ferroelectric thin film 38 induces dielectric polarization of the dielectric film 45, two states appear in accordance with the direction of the spontaneous polarization: namely, a state in which a depletion layer appears in the surface of the semiconductor immediately under the gate and a state in which the depletion layer does not appear. Therefore, it is possible to turn the electric current flowing between the source region 43 and the drain region 44 ON and OFF in accordance with the direction of the spontaneous polarization of the ferroelectric thin film 38. Thus, it is possible to read the direction of the spontaneous polarization (data) by measuring the electric current flowing between the source and the drain to determine whether the state is the ON state or the OFF state.

In this case, since the reading operation does not involve the polarization inversion, the operation is non-destructive. Also, since the spontaneous polarization is maintained even after the gate voltage is turned off, the operation as a non-volatile memory is made possible.

In this example, the $Bi_4Ti_3O_{12}$ thin film was allowed to have the c-axis orientation. This is because utilization of the small coercive field component in the c-axis direction is effective in reducing the voltage for rewriting the data (inversion of the spontaneous polarization direction). Especially, since $SiO_2$ having a low dielectric constant is used as the dielectric film 45 in this Example, most of the voltage applied to the ferroelectric thin film gate is applied to $SiO_2$, so that only a small portion of the applied voltage is applied to the ferroelectric thin film 38 which performs an essential function. Therefore, it is necessary to make the coercive field as small as possible in order to invert the polarization of the ferroelectric thin film 38 securely to rewrite the data According to the present invention, since a buffer layer comprising a bismuth oxide polycrystal thin film is used, it is possible to lower the crystallization temperature of a bismuth-based layered compound thin film as compared with the case with no buffer layer and to increase the crystal nucleus generation density. Further, by a synergistic effect with the suppression of crystal grain growth by lowering the crystallization temperature, it is possible to obtain a dense film structure. Also, since the elements constituting the buffer layer are included in the bismuth-based layered compound formed thereon, it is possible to prevent impurities from being mingled therein. Furthermore, since the buffer layer is not present in the ferroelectric thin film obtained in the end, it is possible to obtain a ferroelectric thin film in which the buffer layer and the bismuth-based layered compound thin film are integrally formed into a single-phase.

Particularly, if the buffer layer has a film thickness of 50 nm or less and the bismuth-based layered compound thin film has a film thickness of 50 nm or more and 200 nm or less, it is possible to prevent the surface morphology of the buffer layer from degrading the surface morphology of the bismuth-based layered compound thin film positioned thereon. Therefore, although the film is thin, it is possible to prevent generation of pinholes constituting the paths for electric current leakage and to lower the voltage to be applied for polarization inversion of the ferroelectric thin film, thereby reducing the operation voltage in practical application to a device. Also, since the ferroelectric thin film of the present invention has a flat surface and a dense film structure, improvement of processing accuracy can be achieved in a fine processing such as dry etching necessary for practical fabrication of a device.

Also, if the above ferroelectric thin film is a film specifically made of bismuth titanate, it is possible to control the orientation easily, so that a ferroelectric thin film having a property necessary for the intended device can be realized with good reproducibility.

Further, according to the manufacturing method of the present invention, since the film can be formed by the MOCVD method, it is possible to fabricate a ferroelectric thin film which prevents impurities from being mingled, lowers the possible film-forming temperature, increases the crystal nucleus growth density, controls the increase in the size of the crystal granule, and is dense with a flat surface. Especially, in the case where the obtained ferroelectric thin film is made of a material having a ferroelectric property with strong anisotropy such as $Bi_4Ti_3O_{12}$, a thin film having an orientation with material characteristics suitable for each intended device can be fabricated easily with good reproducibility. Also, since the orientation can be changed with the composition of the thin film maintained to be the stoichiometric composition, generation of the lattice defects due to excess or insufficient atoms in the film can be suppressed, so that the deterioration in the material characteristics can be suppressed even if the orientation is changed.

Particularly, in the case where the film-forming temperature of the buffer layer is within the range of 350° C. to 450° C., the buffer layer itself can be made extremely thin by the low-temperature growth. Also, even if all the film-forming processes are conducted at a temperature of 450° C. or less, it is possible to crystallize the bismuth-based layered compound thin film sufficiently. Further, reaction of the ferroelectric thin film with other materials constituting the device and thermal damage to other elements formed on the substrate, which were problems in conventional film-forming methods using a high-temperature process, can be greatly alleviated.

Furthermore, by controlling the amount of oxygen-containing gas to be supplied at the time of forming the film, it is possible to form a thin film having a desired composition ratio and the control of the orientation is facilitated, so that a thin film having a desired orientation can be realized with good reproducibility.

Especially, by setting a condition of maintaining the amount of the Bi and Ti materials (carrier gas flow rate) to be constant and maintaining the flow rate of the total used gases including the amount of oxygen-containing gas to be constant in the case where the ferroelectric thin film is to be formed of bismuth titanate thin film, it is possible to obtain a bismuth titanate $Bi_4Ti_3O_{12}$ crystal in which the ferroelectric thin film has a (117) predominant orientation by allowing the ratio of the flow rate of the oxygen-containing gas relative to the flow rate of the total gases to be within the range of 60% to 80%, and it is possible to obtain a bismuth titanate $Bi_4Ti_3O_{12}$ crystal in which the ferroelectric thin film has a (00r), i.e. c-axis predominant orientation by allowing the ratio of the flow rate of the oxygen-containing gas relative to the flow rate of the total gases to be within the range of 20% to 40%. Thus, it is possible to separately fabricate, with good reproducibility, a variety of thin films from a thin film with a (117) predominant orientation containing an a-axis direction component having a large spontaneous polarization component of $Bi_4Ti_3O_{12}$ crystal to a thin film with a c-axis predominant orientation having a small coercive field while simplifying the film-forming process by changing only the amount of the oxygen-containing gas to be supplied. Also, by allowing the Bi/Ti composition ratio to be 1.0 or more, it is possible to suppress the generation of $Bi_2Ti_2O_7$ phase having a pyrochlore structure which is an ordinary dielectric substance.

Further, according to the present invention, it is possible to utilize the ferroelectric thin film having the above-mentioned desired property as an element, the device can be allowed to have a desired property and it is possible to realize a good element which is highly reliable.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What is claimed is:

1. A process of manufacturing a ferroelectric thin film, comprising the steps of:

vaporizing organic metal materials each containing one of metal elements constituting the ferroelectric thin film to yield organic metal material gases;

supplying the organic metal material gases onto a substrate having a bismuth oxide polycrystal thin film as a buffer layer together with a carrier gas and an oxygen-containing gas, while controlling a flow rate of the oxygen containing gas with respect to a total flow rate of the organic metal material gases so as to form a bismuth-based layered compound thin film represented by the formula:

$Bi_2A_{m-1}B_mO_{3m+3}$ wherein A is an atom selected from the group consisting of Na, K, Pb, Ca, Sr, Ba and Bi; B is an atom selected from the group consisting of Fe, Ti, Nb, Ta, W and Mo; and m is an integer of 1 or more, whereby the beforehand formed bismuth oxide polycrystal thin film and the bismuth-based layered compound thin film are combined into a single-phase ferroelectric thin film.

2. The process of manufacturing a ferroelectric thin film of claim 1, wherein the bismuth oxide polycrystal thin film is formed to a thickness of 50 nm or less at a temperature in the range of 350 to 450° C.

3. The process of manufacturing a ferroelectric thin film of claim 1 or 2, wherein the bismuth-based layered compound thin film is formed to a thickness in the range of between 50 and 200 nm at a temperature in the range of 400 to 450° C.

4. The process of manufacturing a ferroelectric thin film of claim 1, wherein the formation of the bismuth-based layered compound thin film is carried out by supplying the organic metal material gases and the inert carrier gas at constant flow rates and supplying the oxygen-containing gas at a flow rate of 20 to 40 vol % or 60 to 80 vol % with respect to a total flow rate of the organic metal material gases, the inert carrier gas and the oxygen-containing gas used.

5. The process of manufacturing a ferroelectric thin film of claim 1, wherein the formation of the bismuth-based layered compound thin film is carried out by supplying the two organic metal material gases containing Bi and Ti respectively at constant flow rates sufficient to react and the inert carrier gas at a constant flow rate and the oxygen-containing gas at a flow rate of 20 to 40 vol % with respect to a total flow rate of the two organic metal material gases, the inert carrier gas and the oxygen-containing gas used, thereby forming the ferroelectric thin film having a Bi/Ti composition ratio in the range of 1.33 or less and 1.0 or more, and showing an X-ray diffraction pattern which coincides with an X-ray diffraction pattern of a single-phase bismuth titanate crystal $Bi_4Ti_3O_{12}$ and which exhibits (00r) reflections, wherein r is an even integer, as major reflections.

6. The process of manufacturing a ferroelectric thin film of claim 1, wherein the formation of the bismuth-based layered compound thin film is carried out by supplying the two organic metal material gases containing Bi and Ti respectively at constant flow rates sufficient to react and the inert carrier gas at a constant flow rate and the oxygen-containing gas at a flow rate of 60 to 80 vol % with respect to a total flow rate of the two organic metal material gases, the inert carrier gas and the oxygen-containing gas used, thereby forming the ferroelectric thin film having a Bi/Ti composition ratio in the range of 1.33 and 1.5 or less, and showing an X-ray diffraction pattern which coincides with an X-ray diffraction pattern of a single-phase bismuth titanate crystal $Bi_4Ti_3O_{12}$ and which exhibits a (117) reflection as a major reflection.

7. The process of manufacturing a ferroelectric thin film according to claim 1, wherein the metal material gases comprise at least one selected from the group consisting of $BiH_3$, $BiCl_3$, $BiBr_3$, $BiI_3$, $Bi(CH_3)_3$, $Bi(C_2H_5)_3$, $Bi(n-C_3H_7)_3$, $Bi(n-C_4H_9)_3$, $Bi(i-C_4H_9)_3$, $Bi(n-C_5H_{11})_3$, $Bi(C_6H_5)_3$, $Bi(o-C_7H_7)_3$, $Bi(2-CH_3C_6H_4)_3$, $Bi(4-CH_3C_6H_4)_3$, $Bi(OCH_2CH_2)N(CH_3)_2)_3$, $Bi(OCHCH_3CH_2N(CH_3)_2)_3$, and $Bi(OC(CH_3)_2CH_2CH_3)_3$.

8. The process of manufacturing a ferroelectric thin film according to claim 1, wherein the metal material gases comprise at least one selected from the group consisting of $PbCl_3$, $Pb(CH_3)_4$, $Pb(C_2H_5)_4$, $Pb(n-C_3H_7)_4$, $Pb(C_6H_5)_4$, $Pb(CH_2)_3OCH_2C(CH_3)_3$, $Pb(thd)_2$, $SrCl_2$, $Sr(C_2H_5)_2$, $Sr(C_5(CH_3)_5)_2$, $Sr(thd)_2$, $BaCl_2$, $Ba(C_2H_5)_2$, $Ba(C_5(CH_3)_5)_2$, $Ba(thd)_2$, $TiCl_4$, $Ti(C_5H_5)Cl_2$, $Ti(OCH_3)_4$, $Ti(OC_2H_5)_4$, $Ti(O-i-C_3H_7)_4$, $Ti(O-n-C_3H_7)_4$, $Ti(O-n-C_4H_9)_4$, $Ti(O-t-C_4H_9)_4$, $Ti(O-n-C_5H_{11})_4$, $Ti(thd)_2$, $TiCl_2(thd)_2$, $NbCl_5$, $Nb(C_5H_5)Cl_5$, $Nb(OCH_3)_5$, $Nb(OC_2H_5)_5$, $Nb(O-n-C_3H_7)_5$, $Nb(O-i-C_3H_7)_5$, $Nb(O-t-C_4H_9)_5$, $Nb(O-n-C_5H_{11})_5$, $TaCl_5$, $Ta(C_5H_5)Cl_5$, $Ta(OCH_3)_5$, $Ta(OC_2H_5)_5$, $Ta(O-n-C_3H_7)_5$, $Ta(O-i-C_3H_7)_5$, $Ta(O-n-C_4H_9)_5$, $Ta(O-t-C_4H_9)_5$, and $Ta(O-n-C_5H_{11})_5$.

9. The process of manufacturing a ferroelectric thin film according to claim 1, wherein the bismuth-based layered compound thin film is formed from $Bi_4Ti_3O_{12}$, $SrBi_2Ta_2O_9$, $SrBi_2Nb_2O_9$, $BaBi_2Nb_2O_9$, $BaBi_2Ta_2O_9$, $PbBi_2Nb_2O_9$, $PbBi_2Ta_2O_9$, $PbBi_4Ti_4O_{15}$, $SrBi_4Ti_4O_{15}$, $BaBi_4Ti_4O_{15}$, $PbBi_4Ti_4O_{15}$, $Sr_2Bi_4Ti_5O_{18}$, $Pb_2Bi_4Ti_5O_{18}$, $Na_{0.5}Bi_{4.5}Ti_4O_{15}$, or $K_{0.5}Bi_{4.5}Ti_4O_{15}$.

10. The process of manufacturing a ferroelectric thin film according to claim 1, wherein the single-phase ferroelectric thin film has a single crystalline phase structure a composition constant in the direction of the film thickness.

11. The process of manufacturing a ferroelectric thin film according to claim 1, wherein the single-phase ferroelectric thin film has a composition constant in the direction of the film thickness.

* * * * *